United States Patent
Bunton et al.

(10) Patent No.: US 10,615,001 B2
(45) Date of Patent: Apr. 7, 2020

(54) WIDE FIELD-OF-VIEW ATOM PROBE

(71) Applicant: CAMECA INSTRUMENTS, INC., Madison, WI (US)

(72) Inventors: Joseph Hale Bunton, Madison, WI (US); Michael Steven Van Dyke, Fitchburg, WI (US)

(73) Assignee: Cameca Instruments, Inc., Madison, WI (US)

( * ) Notice: Subject to any disclaimer, the term of this patent is extended or adjusted under 35 U.S.C. 154(b) by 0 days.

(21) Appl. No.: 15/566,769

(22) PCT Filed: Apr. 21, 2015

(86) PCT No.: PCT/US2015/026912
§ 371 (c)(1),
(2) Date: Oct. 16, 2017

(87) PCT Pub. No.: WO2016/171675
PCT Pub. Date: Oct. 27, 2016

(65) Prior Publication Data
US 2018/0130636 A1    May 10, 2018

(51) Int. Cl.
*H01J 37/285*    (2006.01)
*H01J 49/16*    (2006.01)

(52) U.S. Cl.
CPC .......... *H01J 37/285* (2013.01); *H01J 49/164* (2013.01); *H01J 49/16* (2013.01); *H01J 2237/2626* (2013.01)

(58) Field of Classification Search
None
See application file for complete search history.

(56) References Cited

U.S. PATENT DOCUMENTS 3,863,068 A    1/1975    Poschenrieder
5,061,850 A    10/1991    Kelly et al.
(Continued)

FOREIGN PATENT DOCUMENTS

JP    S5818849 B2 *    4/1983
JP    2000-036282    2/2000
JP    2014-078388    5/2014

OTHER PUBLICATIONS

Japanese Patent Office, Dec. 25, 2018 Office Action for parallel Japanese Patent Appl'n. 2017-555585.

*Primary Examiner* — James Choi
(74) *Attorney, Agent, or Firm* — Craig A. Fieschko, Esq.; DeWitt LLP

(57) ABSTRACT

In an atom probe having a specimen mount spaced from a detector, and preferably having a local electrode situated next to the specimen mount, a lens assembly is insertable between the specimen (and any local electrode) and detector. The lens assembly includes a decelerating electrode biased to decelerate ions from the specimen mount and an accelerating mesh biased to accelerate ions from the specimen mount. The decelerating electrode and accelerating mesh cooperate to divert the outermost ions from the specimen mount—which correspond to the peripheral areas of a specimen—so that they reach the detector, whereas they would ordinarily be lost. Because the detector now detects the outermost ions, the peripheral areas of the specimen are now imaged by the detector, providing the detector with a greatly increased field of view of the specimen, as much as 100 degrees (full angle) or more.

11 Claims, 3 Drawing Sheets

(56) References Cited

U.S. PATENT DOCUMENTS

| | | | |
|---|---|---|---|
| 5,278,406 A | 1/1994 | Kinoshita | |
| 5,394,054 A * | 2/1995 | Chen | H01J 29/484 |
| | | | 313/412 |
| 5,440,124 A | 8/1995 | Kelly et al. | |
| 5,614,711 A * | 3/1997 | Li | B01D 59/44 |
| | | | 250/282 |
| 5,621,285 A * | 4/1997 | Gorski | H01J 29/488 |
| | | | 313/414 |
| 6,274,866 B1 * | 8/2001 | Li | H01J 49/405 |
| | | | 250/281 |
| 6,580,069 B1 | 6/2003 | Cerezo | |
| 6,661,013 B2 | 12/2003 | Jagutzki et al. | |
| 6,740,872 B1 | 5/2004 | Holle | |
| 7,157,702 B2 * | 1/2007 | Gribb | B82Y 15/00 |
| | | | 250/306 |
| 7,619,213 B2 * | 11/2009 | Li | H01J 49/061 |
| | | | 250/281 |
| 7,652,269 B2 | 1/2010 | Bunton et al. | |
| 7,683,318 B2 | 3/2010 | Bunton et al. | |
| 7,884,323 B2 | 2/2011 | Kelly et al. | |
| 8,074,292 B2 | 12/2011 | Bostel et al. | |
| 8,134,119 B2 | 3/2012 | Panayi | |
| 8,276,210 B2 | 9/2012 | Vurpillot et al. | |
| 8,513,597 B2 | 8/2013 | Panayi | |
| 8,575,544 B1 | 11/2013 | Kelly et al. | |
| 2004/0256578 A1 * | 12/2004 | Mitchell | H01J 37/3171 |
| | | | 250/492.21 |
| 2007/0145916 A1 * | 6/2007 | Caporaso | H05H 7/00 |
| | | | 315/505 |
| 2010/0001202 A1 * | 1/2010 | Matsuda | H01J 37/12 |
| | | | 250/396 R |
| 2010/0223698 A1 * | 9/2010 | Bostel | H01J 49/0004 |
| | | | 850/33 |
| 2014/0097339 A1 | 4/2014 | Suzuki et al. | |
| 2014/0097340 A1 | 4/2014 | Suzuki et al. | |
| 2018/0158665 A1 * | 6/2018 | Eiceman | G01N 27/622 |
| 2019/0074154 A1 * | 3/2019 | Woodman | H01J 29/48 |

* cited by examiner

WIDE FIELD-OF-VIEW ATOM PROBE

FIELD OF THE INVENTION

This document concerns an invention relating generally to atom probes, and more specifically to atom probes with improved field of view of specimens to be analyzed.

BACKGROUND OF THE INVENTION

An atom probe, also referred to as an atom probe microscope, is a device which allows specimens to be analyzed on an atomic level. A typical atom probe includes a specimen mount, a local electrode, and a detector. During typical analysis, a specimen is situated in the specimen mount and a positive electrical charge (e.g., a baseline voltage) is applied to the specimen such that the electrostatic field near the apex of the specimen is approximately 90% of that required to spontaneously ionize surface atoms (generally on the order of 5 to 50 volts per nanometer). The detector is spaced apart from the specimen and is either grounded or negatively charged. The local electrode is located between the specimen and the detector, and is either grounded or negatively charged. (The local electrode is sometimes referred to as a "counter electrode" or "extraction electrode"; additionally, because electrodes in an atom probe typically serve as electrostatic lenses, the term "lens" is sometimes used in place of the term "electrode.") A positive electrical pulse (above the baseline voltage), a laser pulse (e.g., photonic energy), and/or another pulsed form of ionization energy (e.g., an electron beam or packet, ion beam, RF pulse, etc.) is intermittently applied to the specimen to increase the probability that surface atoms on the specimen will ionize. Alternatively or additionally, a negative voltage pulse can be applied to the local electrode in synchrony with the foregoing energy pulse(s). Occasionally, a pulse will cause ionization of a single atom near the tip of the specimen. The ionized atom(s) separate or "evaporate" from the surface, pass through an aperture in the local electrode, and impact the surface of the detector, typically a microchannel plate (MCP). The elemental identity of an ionized atom can be determined by measuring its time of flight (TOF), the time between the pulse that liberates the ion from the surface of the specimen and the time it impinges on the detector. The velocity of the ions (and thus their TOF) varies based on the mass-to-charge-state ratio (m/n) of the ionized atom, with lighter and/or more highly charged ions taking less time to reach the detector. Since the TOF of an ion is indicative of the mass-to-charge ratio of the ion, which is in turn indicative of elemental identity, the TOF can help identify the composition of the ionized atom. In addition, the location of the ionized atom on the surface of the specimen can be determined by measuring the location of the atom's impact on the detector. Thus, as the specimen is evaporated, a three-dimensional map or image of the specimen's constituent atoms can be constructed. While the image represented by the map is a point projection, with atomic resolution and a magnification of over 1 million times, the map/image data can be analyzed in virtually any orientation, and thus the image can be considered more tomographic in nature. Further details on atom probes can be found, for example, in U.S. Pat. Nos. 5,440,124; 7,157,702; 7,683,318; 7,884,323; 8,074,292; 8,276,210; 8,513,597; and 8,575,544, as well as in the patents and other literature referenced therein.

One of the most important specifications of an atom probe is its mass resolving power, i.e., the ability to discern one ionic species from another. In general, a mass resolving power of 500 or better is desired for most applications, where the mass resolving power is defined as $m/\Delta m$ at full-width-half-maximum. Another important specification is its field of view, i.e., the area of the specimen imaged by the detector (or, stated differently, the area of the specimen from which ions can be collected with reasonable correlation to their original positions on the specimen). Field of view can be increased by decreasing the length of the ion flight path between the specimen and the detector, but this comes at a cost to mass resolving power, which benefits from longer flight paths (and thus longer TOF). TOF can be increased with the use of local electrodes, pulsed lasers, or other sources of ionization energy that allow the application of lower voltages to the specimen (and thereby decrease the departure speed of ions evaporating from the specimen), thereby allowing closer spacing of the specimen and detector (and greater field of view) with lesser degradation of mass resolving power. However, as of late 2014, high-performance atom probes using local electrodes and lasers typically have an angular field of view of no greater than 40-60 degrees full-angle, with maximum mass resolving power of 700-800 at the center of the field of view (and decreasing away from the center). Mass resolution can also be enhanced by use of energy compensating electrodes/lenses, such as a Poschenrieder lens (e.g., U.S. Pat. No. 3,863,068) or a reflectron (e.g., U.S. Pat. No. 6,740,872). These lenses bend or reflect the flight path and allow longer TOF, but typically have a very narrow field of view due to the limited acceptance angle of these lenses (the acceptance angle being the angle defined by the outer bounds of the cone of ions emitted by the specimen). The reflectron of U.S. Pat. No. 8,134,119 has a unique curved surface which provides a large acceptance angle, allowing a field of view of approximately 50 degrees full-angle, while simultaneously providing a mass resolving power of 1000 or more.

However, in order to collect all (or nearly all) ions emitted from a specimen apex, a field of view of approximately 100 degrees (full angle) is needed. Such a "full field of view" atom probe was not known to exist, and the means for constructing such an atom probe—even with vastly inferior mass resolving power—was unknown.

SUMMARY OF THE INVENTION

The invention involves atom probe electrostatic lens assemblies, as well as atom probes incorporating the lens assemblies, which are intended to at least partially solve the aforementioned problems. To give the reader a basic understanding of some of the advantageous features of the invention, following is a brief summary of preferred versions of the lens assemblies (and associated atom probes), with reference being made to the accompanying drawings to assist the reader's understanding (and with the drawings being briefly described in the following "Brief Description of the Drawings" section of this document). Since the following discussion is merely a summary, it should be understood that more details regarding the preferred versions may be found in the Detailed Description set forth elsewhere in this document. The claims set forth at the end of this document then define the various versions of the invention in which exclusive rights are secured.

FIG. 1 presents a simplified schematic view of an exemplary preferred atom probe lens assembly 100, as incorporated into an atom probe 1000. The lens assembly 100 includes a local electrode 110, a decelerating electrode 120, and an accelerating mesh 130, with the decelerating electrode 120 being situated between the local electrode 110 and the accelerating mesh 130. The local electrode 110 has a local electrode emitter side 112, an opposing local electrode detector side 114, and a local electrode thickness therebetween, with a local electrode aperture 116 extending between the local electrode emitter side 112 and the local electrode detector side 114. Similarly, the decelerating electrode 120 has a decelerating electrode emitter side 122, an opposing decelerating electrode detector side 124, and a decelerating electrode thickness therebetween, with a decelerating electrode aperture 126 extending between the decelerating electrode emitter side 122 and decelerating electrode detector side 124. The accelerating mesh 130 likewise has an accelerating mesh emitter side 132 and an opposing accelerating mesh detector side 134 with an accelerating mesh thickness therebetween, and is oriented at least substantially perpendicular to an axis extending centrally through the local electrode aperture 116 and the decelerating electrode aperture 126.

When provided in an atom probe 1000, the lens assembly 100 is situated between a specimen mount 1002 (which bears the specimen 10 to be analyzed) and a detector 1004 situated to receive ions from the decelerating electrode 120 and accelerating mesh 130, with the local electrode 110, decelerating electrode 120, and accelerating mesh 130 being provided in series between the specimen mount 1002 and detector 1004 (and with the local electrode aperture 116 and decelerating electrode aperture 126 aligned with the specimen mount 1002 and with each other, whereby the flight path of ions from the specimen 10 extends through the apertures 116 and 126). In operation, the local electrode 110 and/or specimen mount 1002 are biased (i.e., charged) to promote emission of ions from any specimen 10 on the specimen mount 1002, with such emission possibly being assisted by another source of ionization energy (e.g., a laser 1006). The decelerating electrode 120 is biased to decelerate ions received from the local electrode 110, preferably by biasing it to a potential between those of the specimen mount 1002 and the local electrode 110. The accelerating mesh 130 is biased to accelerate ions received from the decelerating and local electrodes 120 and 110 and direct them onto the detector 1004. Preferably, the accelerating mesh 130 is biased more strongly than the local electrode 110 with respect to the specimen mount 1002, such that the specimen mount 1002 and accelerating mesh 130 have a potential difference therebetween which is greater than a potential difference between the specimen mount 1002 and the local electrode 110. As will be discussed below, various components may optionally be situated between the lens assembly 100 and the detector 1004, with the exemplary arrangement of FIG. 1 having a funnel-shaped electrode 1008 having an at least substantially neutral bias with respect to the detector 1004 and/or accelerating mesh 130 so as to provide a "drift region" between the accelerating mesh 130 and the detector 1004 (i.e., a region with negligible applied electric fields, so that the speed and trajectory of ions traveling through the drift region are essentially unaffected). The lens assembly 100 beneficially provides the atom probe 1000 with a field of view of greater than 90 degrees (full angle), i.e., the detector 1004 has a field of view of a specimen 10 in the specimen mount 1002 of greater than 90 degrees (full angle), with a field of view of 100 degrees (full angle) or greater being readily achievable. In contrast, typical atom probes have a field of view of approximately 40-60 degrees (full angle). At the same time, the atom probe 1000 can have a mass resolving power (m/Δm) which is at least comparable to conventional atom probes using local electrodes, i.e., a mass resolving power of approximately 750-1000 near the center of the field of view, with mass resolving power decreasing with greater distance from the center (to approximately 400-500 at 50 degrees).

Another significant advantage of the wide field of view is that data acquired from the specimen surface can be used to improve the closed loop control of the specimen bias. Modern atom probes utilize complex control algorithms to quickly adjust the specimen bias as the specimen evolves. In particular, when a material that evaporates under a lower field is exposed on the apex of the specimen, the specimen bias must be quickly reduced. Failing to do so will result in rapid evaporation of the new material, unnecessarily high stresses on the specimen, and potentially specimen fracture. Many types of specimens undergo reshaping at the specimen periphery, with an extreme example being from specimens that contain multilayered thin films. Each successive layer in a multilayered specimen is first exposed on the periphery of the specimen as the specimen erodes; if a newly exposed layer requires a substantially lower evaporation field, it will begin to evaporate at an uncontrolled rate until enough erosion occurs to place this layer within the field of view of the instrument. Previous atom probe designs were blind to the edges of the sample, making it impossible to appropriately adjust the specimen bias when a new layer is first exposed. This problem is greatly reduced in an atom probe having a full field of view.

Certain locations and configurations for the components of the lens assembly 100 assist in providing superior performance. The local electrode 110 is closer to the decelerating electrode 120 than to the accelerating mesh 130, with the local electrode 110 and the decelerating electrode 120 preferably being spaced from each other by a distance equal to or less than approximately the sum of the local electrode thickness and the decelerating electrode thickness (typically, a distance of 3 mm or less). The decelerating electrode detector side 124 is preferably spaced from the specimen mount 1002 by no greater than 40% of the length of the ion flight path between the specimen mount 1002 and the detector 1004, and is preferably concave. The accelerating mesh detector side 134 is preferably spaced from the specimen mount 1002 by no greater than 80% of the length of the ion flight path between the specimen mount 1002 and the detector 1004.

Because some of the evaporated ions will strike the accelerating mesh 130, the accelerating mesh 130 will effectively cast a shadow of the specimen 10 on the detector 1004 (and thus on the specimen's image). To reduce shadow effects, it can be useful to movably mount the accelerating mesh 130 in connection with an actuator 1010, such that the actuator 1010 can move the accelerating mesh 130 out of the ion flight path (preferably along with the decelerating electrode 120) to an extent sufficient that the accelerating mesh 130 does not interfere with ions traveling from the local electrode 110 (both physically, as by blocking ions, and electromagnetically, i.e., the accelerating mesh 130 does not distort the fields of the decelerating electrode 120, detector 1004, and other elements of the atom probe 1000). Removal of the accelerating mesh 130 increases detection efficiency, though at the cost of decreased field of view. Alternatively or additionally, the actuator 1010 can be configured to dither (i.e., reciprocate, rotate, or otherwise move) the accelerating mesh 130 along a plane oriented at least substantially perpendicular to the ion flight path, whereby the accelerating mesh 130 can continuously or periodically be moved during data collection from a specimen 10. The dithering accelerating mesh 130 will then cause occasional loss of ions from a variety of locations around the specimen 10, as opposed to having a fixed-location accelerating mesh 130 cause certain loss of all ions having the fixed-location accelerating mesh 130 in their path, thereby decreasing the impact of any shadow on the image.

Further advantages, features, and objects of the invention will be apparent from the remainder of this document in conjunction with the associated drawings.

DETAILED DESCRIPTION OF PREFERRED VERSIONS OF THE INVENTION

Figure 1:
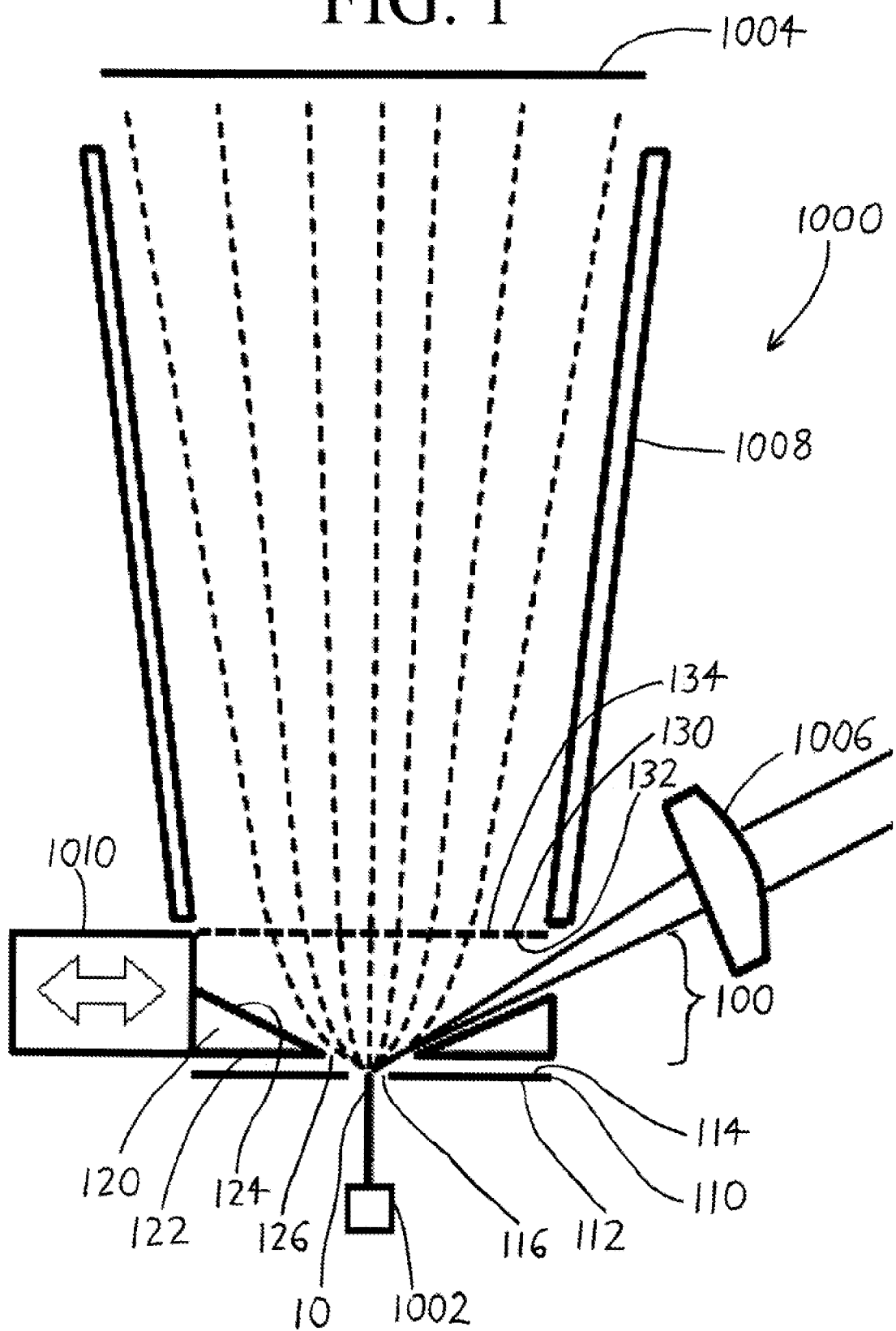
FIG. 1 is a schematic cross-sectional view of an exemplary preferred lens assembly 100 installed within an exemplary atom probe 1000, showing the local electrode 110, decelerating electrode 120, and accelerating mesh 130 of the lens assembly 100 situated between a specimen 10 and a detector 1004, with a laser 1006 oriented at the specimen 10 to promote ionization.

Reviewing the foregoing discussion of the lens assembly 100 in greater detail, the exemplary version of the lens assembly 100 shown in FIG. 1 has its local electrode 110, decelerating electrode 120, and accelerating mesh 130 situated in series within a straight flight path atom probe 1000 between a specimen 10 to be analyzed and a detector 1004. A field-free drift region, which is optional, is situated between the accelerating mesh 130 and the detector 1004, and is provided by an electrode 1008 surrounding the ion flight paths (schematically depicted by phantom/dashed lines). In operation, an optical microscope or other alignment tool is used to situate the specimen 10 coaxially with the local electrode aperture 116, with its specimen apex roughly within the plane of the aperture 116 for superior electric field enhancement (and ease of specimen ionization). If the specimen 10 extends slightly through the local electrode aperture 116, it preferably does so by no greater than a distance r (r being the radius of the local electrode aperture 116, typically 50-150 µm). Further extension through the aperture 116 decreases field enhancement on the specimen 10 apex, while at the same time increasing the field on the local electrode 110 about its aperture 116. The increased field on the local electrode 110 can result in field emission of electrons from the local electrode 110, which creates noise on the detector 1004 and may damage both the specimen 10 and the local electrode 110. If the specimen 10 is spaced from the local electrode aperture 116, it is preferably spaced by a distance no greater than 0.78 r to avoid the aperture's interference with the detector's field of view of the specimen 10.

The local electrode 110 is then preferably maintained at a bias that is substantially less than that of the specimen 10, thereby promoting ion emission from the specimen 10 and through the local electrode aperture 116. The local electrode 110 serves to increase the electric field on the specimen surface to promote evaporation of ions from the specimen 10, and also shields the specimen 10 from the electric fields created by the decelerating electrode 120. While the local electrode 110 is depicted in FIG. 1 as a (disc-shaped) planar electrode having the local electrode aperture 116 formed at its center, other configurations are possible, e.g., a bowl shape with either the concave or convex side oriented toward the specimen 10, or a conical/funnel shape. However, designs of this nature—which further space the decelerating electrode 120 from the specimen 10—are typically not preferred, as it is preferable to have the decelerating electrode 120 decelerate ions soon after their evaporation from the specimen 10.

The decelerating electrode 120 is preferably maintained at a bias between those of the local electrode 110 and the specimen 10, thereby decelerating ions traveling from the local electrode 110 and through the decelerating electrode aperture 126. Most preferably, the decelerating electrode 120 is kept at a relatively modest bias of approximately 0.5 times the difference of the specimen 10 bias and the local electrode 110 bias, as stronger decelerating voltages can increase chromatic aberration. To reduce aberrations, the shape of the decelerating electrode 120 and its placement with respect to the accelerating mesh 130 and local electrode 110 require careful design. As for the shape of the decelerating electrode 120, its decelerating electrode detector side 124 is preferably concave, with a conical/funnel shape or possibly a bowl shape, such that its surface profile approximates the trajectory of the outermost ions in the "flight cone" defined by the ions evaporated from the specimen 10. The overall thickness of the decelerating electrode 120 can vary depending on the scale of other atom probe 1000 components, but in preferred versions of the lens assembly 100, the thickness is approximately 3-5 mm. The aperture 126 of the decelerating electrode 120 is preferably as small as possible without interfering with the flight path of the ions, and is typically between 1 and 10 mm. As for placement, the decelerating electrode 120 is preferably placed as close to the plane of the local electrode aperture 116 as possible to create a uniform decelerating field concentric with the specimen apex, while at the same time avoiding the local electrode's interference with the fields generated by the decelerating electrode 120 (and accelerating mesh 130). At a minimum, the decelerating electrode 120 could have zero spacing from the local electrode 110—i.e., the aperture of the decelerating electrode 120 could be in the same plane as the aperture of the local electrode 110, with the local electrode 110 being situated within the decelerating electrode aperture 126 (and possibly having a conical/bowled shape which widens as it extends toward the detector 1004, a configuration which may reduce spherical aberration in the atom probe image). With typical operating voltages, the distance between the decelerating electrode 120 and local electrode 110 must be greater than about 50 µm since smaller gaps will result in high voltage breakdown. It is typically sufficient to space the decelerating electrode 120 from the local electrode 110 by a distance up to approximately the sum of the local electrode thickness and the decelerating electrode thickness, which amounts to approximately 3 mm in a preferred version of the FIG. 1 arrangement, but can be as great as 6 mm. At most, the decelerating electrode 120 is preferably spaced from the specimen mount 1002 such that its decelerating electrode detector side 124 is no further than 40% of the length of the ion flight path (as measured between the specimen mount 1002 and the detector 1004).

The accelerating mesh 130 is constructed from an electrically conductive material which preferably has a pitch of greater than 20 lines per centimeter, and a transparency greater than approximately 60%. In a preferred version of the FIG. 1 arrangement, a pitch of 80 lines per centimeter has been found to work well. The accelerating mesh 130 is preferably oriented perpendicular to an axis extending centrally through the local electrode aperture 116 and the decelerating electrode aperture 126, and spaced from the decelerating electrode 120 sufficiently closely that it receives substantially all of the ions from the decelerating electrode 120, and at most is preferably spaced from the specimen mount 1002 such that its detector side 134 is no further than 80% of the length of the ion flight path (as measured between the specimen mount 1002 and the detector 1004). In a preferred arrangement, the accelerating mesh 130 and the decelerating electrode 120 are spaced by a distance approximately equal to the thickness of the decelerating electrode 120 (i.e., 3-5 mm). When the decelerating electrode 120 is biased to decelerate ions, the accelerating mesh 130 is simultaneously biased to attract ions toward the detector 1004, preferably at a potential that is approximately −0.5 times the difference of the specimen voltage and the local electrode voltage. Under the combined influence of the decelerating electrode 120 and accelerating mesh 130, the ion flight paths from the specimen 10—which are typically substantially straight—are pulled inwardly toward the center of the flight cone, giving the flight paths a more parabolic shape and reducing the flight cone's angular spread. This effectively increases the field of view of the detector 1004 without significant spherical aberration. It is notable that while exceptional performance is obtained with a planar mesh 130, the mesh 130 might alternatively be domed/bowled, or otherwise be given a non-planar configuration, to address image artifacts such as spherical aberration. As previously noted, the accelerating mesh 130 is ideally oriented perpendicular to the axis of ion flight, and where a non-planar accelerating mesh 130 is used—e.g., a domed/bowled shape—this perpendicular orientation should be understood to mean that the ion flight axis is perpendicular to, and intersects, a plane tangential to the apex of the dome, or to the base of the bowl, with the dome/bowl extending substantially symmetrically outwardly from the axis.

The transparency of the accelerating mesh 130 limits the overall detection efficiency of the atom probe 1000, since some ions will be "lost" to collision with the mesh. Conventional atom probe detectors have limited detection efficiency due to their use of microchannel plates, and typically, this limit is on the order of 50%. Use of the accelerating mesh 130 can further increase detection losses by approximately 10%-20%, a relatively small amount compared to those caused by the microchannel plates. Nonetheless, the mesh 130 creates a shadow that is highly visible in the data, and also creates spatial variations in the detection efficiency. One way to reduce these issues is to dither the location of the mesh 130, as by reciprocating the mesh 130 along its plane by use of an actuator 1010 such as a piezoelectric flexure stage. Such motion could simply oscillate the mesh 130 along a linear path, or may include more complex motions, e.g., orbiting the mesh 130 along closed paths (e.g., circular, elliptical, hypocycloidal, polygonal, or other closed paths), translating the mesh 130 randomly about a plane, rotating the mesh 130 about its center, etc. Varying the position of the mesh 130 changes the location of the shadow without changing the ion optics of the lens assembly 100. By moving the mesh 130 quickly enough during data collection, with such motion preferably spanning a distance at least equal to the pitch of the mesh 130, the shadow becomes evenly distributed over the entire detector 1004 and is no longer visible in the data. It is particularly preferred that the actuator 1010 (or an adjunct actuator, e.g., an actuator upon which the actuator 1010 rides) be capable of moving the accelerating mesh 130 out of the ion flight path to an extent sufficient that the accelerating mesh 130 does not interfere with ions traveling from the decelerating electrode 120. This allows a user to select from a full field-of-view operating mode wherein the mesh 130 is used (and limits the detection efficiency), and a limited field-of-view operating mode wherein the mesh 130 is removed to enhance detection efficiency. This arrangement allows for a very versatile atom probe design where a user can tailor the flight path to meet experimental requirements.

It is also possible to create a full field-of-view atom probe 1000 without the use of an accelerating mesh 130, by having the face of the detector 1004 take the place of the mesh 130 in the lens assembly 100. Removal of the mesh 130 enhances detection efficiency, but also significantly enhances chromatic aberrations and degrades mass resolving power. Thus, a meshless arrangement is not preferred.

In the preferred arrangement of FIG. 1, the detector 1004 has a diameter greater than 40 mm and is placed at a distance of approximately 100 mm from the specimen 10. As with the accelerating mesh 130, the detector 1004 is also preferably maintained at a bias substantially below that of the local electrode 110, thereby attracting ions toward the detector 1004. In the preferred configuration of FIG. 1, wherein the atom probe 1000 has a straight flight path, the detector 1004 and drift region electrode 1008 are maintained at substantially the same voltage as the accelerating mesh 130. However, a small bias (e.g., 100 V) might be applied to the drift region electrode 1008 to collect stray electrons or ions, thereby reducing noise on the detector 1004. Preferably, the overall length of the drift region is approximately 90% of the total ion flight path. Increasing the length of the drift region enhances mass resolution, albeit at the expense of field of view; for example, doubling the flight path length from 100 mm to 200 mm increases mass resolving power from approximately 750 to 1400, but field of view decreases from approximately 100 degrees (full angle) to 40 degrees. To compare, a conventional atom probe (without decelerating electrode 120 and accelerating mesh 130) having a 100 mm flight path has a field of view of approximately 40 degrees (full angle), but a mass resolving power of only approximately 800—comparable to that of the atom probe 1000 using the lens assembly 100, but with a greatly diminished field of view.

In a conventional straight flight path atom probe, the areal density of detected ions decreases towards the edges of the detector. This results in the edge of the detector being underutilized and degrades the multiple hit performance of the detector (i.e., the detector's ability to discern individual ions when multiple ions strike the detector simultaneously, or nearly so). This problem could potentially be much worse in a full field-of-view atom probe due to the large angular acceptance of the electrostatic lens. However, in the preferred arrangement, the bending of the flight paths achieved by the decelerating electrode 120 and accelerating mesh 130 serves to compress the image towards the edges of the detector 1004 to create a roughly uniform hit density distribution. Because the ion hit detection of the detector 1004 is most reliable when hits are spaced in distance on the detector (and/or in time), distributing the hits across the detector 1004 can enhance the ability to identify distinct hits, as this arrangement will tend to enhance the spacing between at least some of the hits.

Figure 2:
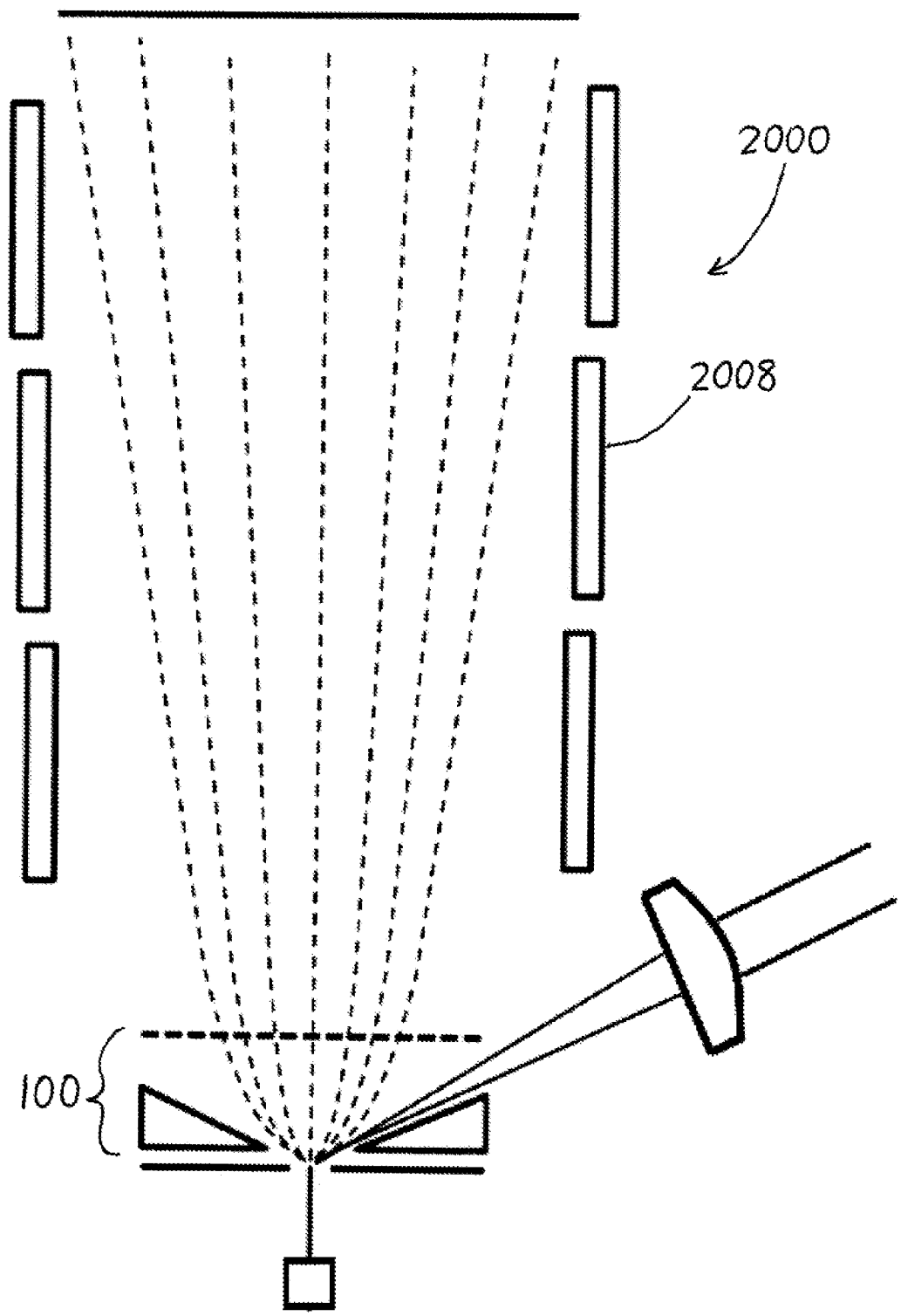
FIG. 2 is a schematic cross-sectional view of another exemplary preferred lens assembly 100 installed within an exemplary atom probe 2000, wherein an Einzel-type lens 2008 is provided in lieu of a drift region electrode 1008 (as in FIG. 1).

The preferred arrangement of FIG. 1 can be enhanced by adding an Einzel-type lens (electrode arrangement) 2008 to the flight path, as shown in FIG. 2. By adding such a lens 2008, the ions can be further collimated and the length of the flight path can be extended. In testing, arrangements similar to FIG. 2 have yielded improved mass resolution near the center of the detector 2004, but deteriorating mass resolution away from the center owing to chromatic aberrations (with chromatic aberrations limiting the overall mass resolving power of the peripheral ion trajectories to approximately m/Δm=400, regardless of the flight path length).

Figure 3:
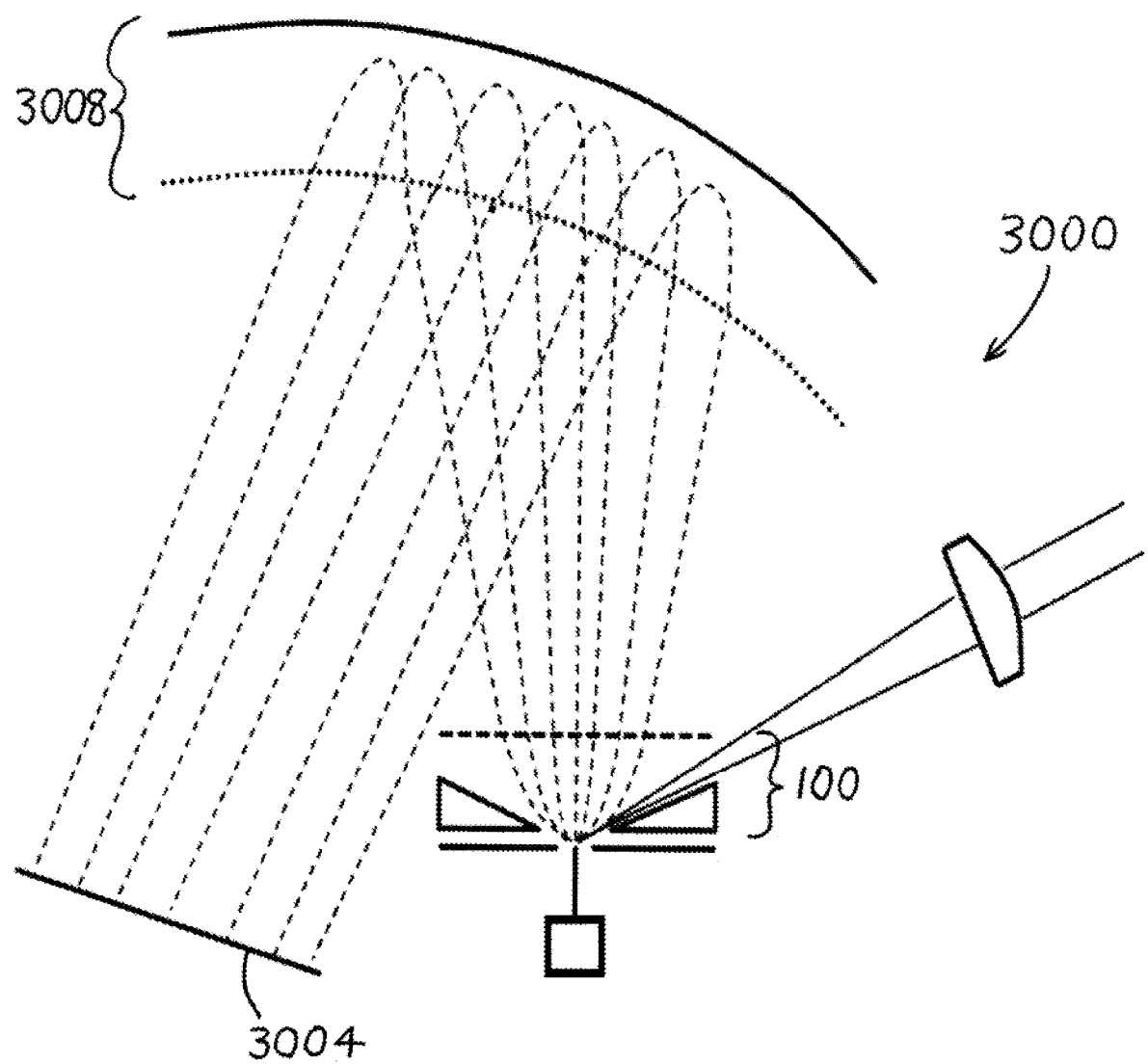
FIG. 3 is a schematic cross-sectional view of another exemplary preferred lens assembly 100 installed within an exemplary atom probe 3000, wherein a reflectron 3008 is situated along the ion flight path between the lens assembly 100 and detector 3004.

Another modification, shown in FIG. 3, involves incorporating a reflectron 3008, e.g., the curved reflectron of U.S. Pat. No. 8,134,119, in an atom probe 3000 incorporating the lens assembly 100. A reflectron 3008 can improve the overall mass resolving power by increasing the total flight time of the ions, and compensating for energy spread of the evaporated ions.

In summary, the lens assembly 100 is capable of adapting conventional atom probe flight paths to allow for an acceptance angle of greater than 60 degrees (full angle), with acceptance angles of greater than 100 degrees being possible, thereby allowing collection of virtually all ions emitted from a typical specimen. The decelerating electrode 120 and accelerating mesh 130 form a compact assembly that may easily be inserted into and removed from the flight path, allowing an atom probe user to trade field-of-view for detection efficiency.

Throughout this document, where a measurement or other value is qualified by the terms "approximately" or "about"—for example, "approximately 50 cm"—this can be regarded as referring to a variation of 10% from the noted value. Thus, "approximately 50 cm" or "about 50 cm" can be understood to mean between 45 and 55 cm.

It should be understood that the versions of the invention described above are merely exemplary, and the invention is not intended to be limited to these versions. Rather, the scope of rights to the invention is limited only by the claims set out below, and the invention encompasses all different versions that fall literally or equivalently within the scope of these claims.

What is claimed is:

1. A specimen-imaging atom probe assembly including:
   a. a specimen mount;
   b. a laser directed to emit a laser beam toward the specimen mount;
   c. a local electrode:
      (1) having a local electrode emitter side and an opposing local electrode detector side with a local electrode thickness therebetween, and a local electrode aperture extending from the local electrode emitter side to the opposing local electrode detector side,
      (2) situated next to the specimen mount, whereby biasing of the local electrode promotes ion emission from any specimen provided on the specimen mount into the local electrode aperture,
      (3) wherein:
         (a) the local electrode aperture is aligned with the specimen mount, and
         (b) the specimen mount is configured to situate any specimen provided on the specimen mount at least approximately within the local electrode aperture;
   d. a decelerating electrode having a decelerating electrode emitter side and an opposing decelerating electrode detector side with a decelerating electrode thickness therebetween;
   e. an accelerating mesh having an accelerating mesh emitter side and an opposing accelerating mesh detector side with an accelerating mesh thickness therebetween, wherein the decelerating electrode is situated between the local electrode and the accelerating mesh;
   f. a detector aligned along an ion flight path extending from the specimen mount, with the local electrode, decelerating electrode, and accelerating mesh situated along the ion flight path;

wherein:
   i. the local electrode and the decelerating electrode are biased to different potentials and spaced from each other by a distance less than approximately the sum of the local electrode thickness and the decelerating electrode thickness,
   ii. the accelerating mesh is spaced closer to the decelerating electrode than to the detector, whereby it receives approximately all emitted ions traveling from the decelerating electrode, and
   iii. the detector has a field of view of a specimen in the specimen mount of greater than 90 degrees (full angle).

2. The atom probe assembly of claim 1 wherein the local electrode is closer to the decelerating electrode than to the accelerating mesh.

3. The atom probe assembly of claim 1 wherein:
   a. the decelerating electrode is biased to decelerate ions traveling from the local electrode;
   b. the accelerating mesh is biased to accelerate ions traveling from the decelerating electrode.

4. The atom probe assembly of claim 1 wherein the local electrode and the decelerating electrode are spaced from each other by a distance of 3 mm or less.

5. The atom probe assembly of claim 1 wherein the decelerating electrode detector side is concave.

6. The atom probe assembly of claim 1 wherein the decelerating electrode detector side is spaced from the specimen mount by no greater than 40% of the length of the ion flight path between the specimen mount and the detector.

7. The atom probe assembly of claim 1 wherein the accelerating mesh detector side is spaced from the specimen mount by no greater than 80% of the length of the ion flight path between the specimen mount and the detector.

8. The atom probe assembly of claim 1 wherein the decelerating electrode has a potential between that of the specimen mount and the local electrode.

9. The atom probe assembly of claim 1 wherein the specimen mount and accelerating mesh have a potential difference therebetween which is greater than a potential difference between the specimen mount and the local electrode.

10. The atom probe assembly of claim 1 further including an actuator configured to move the accelerating mesh out of the ion flight path to an extent sufficient that the accelerating mesh does not interfere with ions traveling from the decelerating electrode.

11. The atom probe assembly of claim 1 further including an actuator configured to dither the accelerating mesh, during ion detection by the detector, along a plane oriented at least substantially perpendicular to the ion flight path.

\* \* \* \* \*